(12) United States Patent
Lin

(10) Patent No.: US 6,482,559 B2
(45) Date of Patent: Nov. 19, 2002

(54) METHOD OF OPTICAL PROXIMITY CORRECTION

(75) Inventor: Chin-Lung Lin, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/016,833

(22) Filed: Dec. 12, 2001

(65) Prior Publication Data

US 2002/0042010 A1 Apr. 11, 2002

Related U.S. Application Data

(63) Continuation of application No. 09/872,411, filed on Jun. 1, 2001, which is a continuation of application No. 09/619,966, filed on Jul. 20, 2000, now Pat. No. 6,265,121, which is a continuation of application No. 09/298,324, filed on Apr. 23, 1999, now Pat. No. 6,120,953.

(51) Int. Cl.$^7$ ................................................ G03F 9/00
(52) U.S. Cl. ........................................ 430/30; 430/296
(58) Field of Search ................................... 430/30, 296

(56) References Cited

U.S. PATENT DOCUMENTS 6,265,121 B1 * 7/2001 Lin .............................. 430/30

* cited by examiner

*Primary Examiner*—Christopher G. Young

(57) ABSTRACT

In a method of optical proximity correction, a main pattern is provided. The main pattern has a critical dimension. When the critical dimension is reduced to reach or fall below a first reference value, a serif/hammerhead is added onto the main pattern. When the critical dimension is further reduced to a second reference value or below, an assist feature is added onto the main pattern. The corrected pattern is then transferred to a layer on the wafer with an improved fidelity.

14 Claims, 4 Drawing Sheets

METHOD OF OPTICAL PROXIMITY CORRECTION

CROSS-REFERENCE TO RELATED APPLICATIONS

This application is a continuation of application Ser. No. 09/872,411, filed Jun. 1, 2001, which is a continuation of application Ser. No. 09/619,966, filed Jul. 20, 2000, now U.S. Pat. No. 6,265,121, which is a continuation of application Ser. No. 09/298,324, filed Apr. 23, 1999, now U.S. Pat. No. 6,120,953. The disclosures of these prior applications are incorporated herein by reference.

BACKGROUND OF THE INVENTION

1. Field of the Invention

The invention relates in general to a method of optical proximity correction (OPC). More particularly, to a method of forming an assist feature, a serif, or a hammerhead on an original pattern, or locally reducing or enlarging the original pattern to reduce optical proximity effect (OPE), so as to optimize the fidelity of the original pattern.

2. Description of the Related Art

In the very advanced fabrication technology of integrated circuits, to reduce the dimensions of devices and to increase the integration are a leading trend and topic for further development. The photolithography and etching step is one of the most crucial factors to determine the reliability and performance of devices and the integrated circuit.

Commensurate with the size reduction, various process limitations have made the photolithography more difficult. The increased integration causes the devices shrinkage and a reduced distance between devices. A deviation is thus easily caused while transferring a pattern from a photo-mask to a layer on a wafer. For example, after being transferred from a photo-mask to a photo-resist layer on a wafer, a right angle corner of the pattern on the photo-mask is often rounded, the line ends would become short, or the line widths increase/decrease, etc. Such effects of deviation are referred to as the optical proximity effect (OPE).

In the integrated circuit of a substantially low integration, these deviations would not greatly affect the performance and operation of devices. However, in the integrated circuit with a high integration, this effect may cause a serious problem. For example, when the line width expands unexpectedly, one metal line may overlap on the other metal line to cause a short circuit, so as to cause a device failure. In other words, the enhancement of operation speed corresponding to the shrinkage of devices is gradually limited due to lack of fidelity for transferred pattern during photolithography processes. An example of optical proximity effect is shown as FIG. 1, in which each corner of a rectangle is rounded, while the linewidth is expanded.

The causes of the optical proximity effect include optical factors (interference between light beams transmitted through adjacent patterns), resist processes (baking temperatures/times, development time, etc), the reflection of light from and irregularity of the substrate. The mainstream of preventing pattern transfer degradation due to the OPE is to add corrections allowing for degradation to a mask in advance. This process is referred to as optical proximity correction (OPC).

Different approaches have been made for the optical proximity correction, for example, U.S. Pat. Nos. 5,732,233 and 5,879,844 to Grazal et al. and Yamamoto et al., respectively, disclose methods of optical proximity correction. In their disclosures, an assist feature is added onto a main pattern, or the linewidth of the main pattern is increased/decreased to increase the contrast for exposure or to enlarge the process window.

Grazal et al. performs an exposure on a test pattern first. The transferred test pattern is then compared to a main pattern to obtain a deviation between these two patterns to determine whether an optical proximity correction is to be performed. In addition, the correction degree can be determined according to the level of deviation.

Referring to FIG. 2, Yamamoto uses a wafer having a conductive layer (oblique lines) on a diffusion layer (dot area) as an example. In this figure, the parallel edges (the bold lines) of the overlapping part of these two layers are the part to be corrected. In addition, while a distance between two neighboring edge lines are narrower than a threshold value, or if a ratio of the length of an edge line to the distance is less than another threshold value, these edges are to be corrected.

By the above conventional method, an empirical result is required for determining whether an optical proximity correction is to be performed on a pattern. Or alternatively, a relationship between two adjacent layers formed on a wafer has to be obtained. Therefore, it causes a great trouble in data processing.

SUMMARY OF THE INVENTION

Accordingly, the invention provides a method of optical proximity correction. Using the critical dimension (CD) of an original main pattern as a determinant of whether an optical proximity correction is performed on the original main pattern, neither an empirical result nor a relationship between two adjacent layers is required. Therefore, the data handling is simplified while fidelity of a transferred pattern is retained.

In the invention, an original pattern to be transferred is provided. The critical dimension of the original pattern is obtained. When the critical dimension is less than or equal to 2.5 times of a wavelength of an exposure light source, serifs are added on each corner of the original pattern, or a hammerhead is added onto each trunk of the pattern. If the critical dimension is less than or equal to the wavelength, an assist feature is added into the original pattern. The original pattern is thus corrected for forwarding an exposure step of a photolithography process. In addition, by correcting the original in a sequence of adding the serifs and hammerhead in front of adding the assist feature, an overlap in the corrected pattern or an overly reduced distance is avoided.

Both the foregoing general description and the following detailed description are exemplary and explanatory only and are not restrictive of the invention, as claimed.

DESCRIPTION OF THE PREFERRED EMBODIMENTS

Typically, the equipment used for a photolithography process includes a reticle, that is, a photo-mask. The reticle has a pattern which reflects a required pattern on a certain layer of an integrated circuit. The reticle can be, for example, a glass plate comprising a transparent portion and a non-transparent portion. The non-transparent portion defines the pattern and is formed by a non-transparent layer, for example, a chromium (Cr) layer. During an exposure step, the reticle is disposed between a light source and the wafer, while a stepper is disposed between the reticle and the wafer. When the light source is incident onto the reticle, the light travels through the transparent portion to project on a photo-resist layer on the wafer under the transparent portion. In contrast, the light source is blocked by the non-transparent portion without shining on the photo-resist layer underlying the non-transparent. The pattern on the photo-mask layer is thus transferred to the photo-resist layer. After development and etching steps, the wafer is patterned.

As mentioned above, as interference or refraction of the light beam through the photo-mask would occur during exposure, on top of other process factors, a distortion occur to the transferred pattern. The invention provides a method for optical proximity correction. By directly measuring the critical dimension of an original pattern, whether the optical proximity correction is performed is determined. The optical proximity correction is performed with a sequence of adding a serif or/and a hammerhead before the addition of an assist feature on the original pattern. Thus, deviation between the transferred pattern and the original pattern is minimized.

Figure 1:
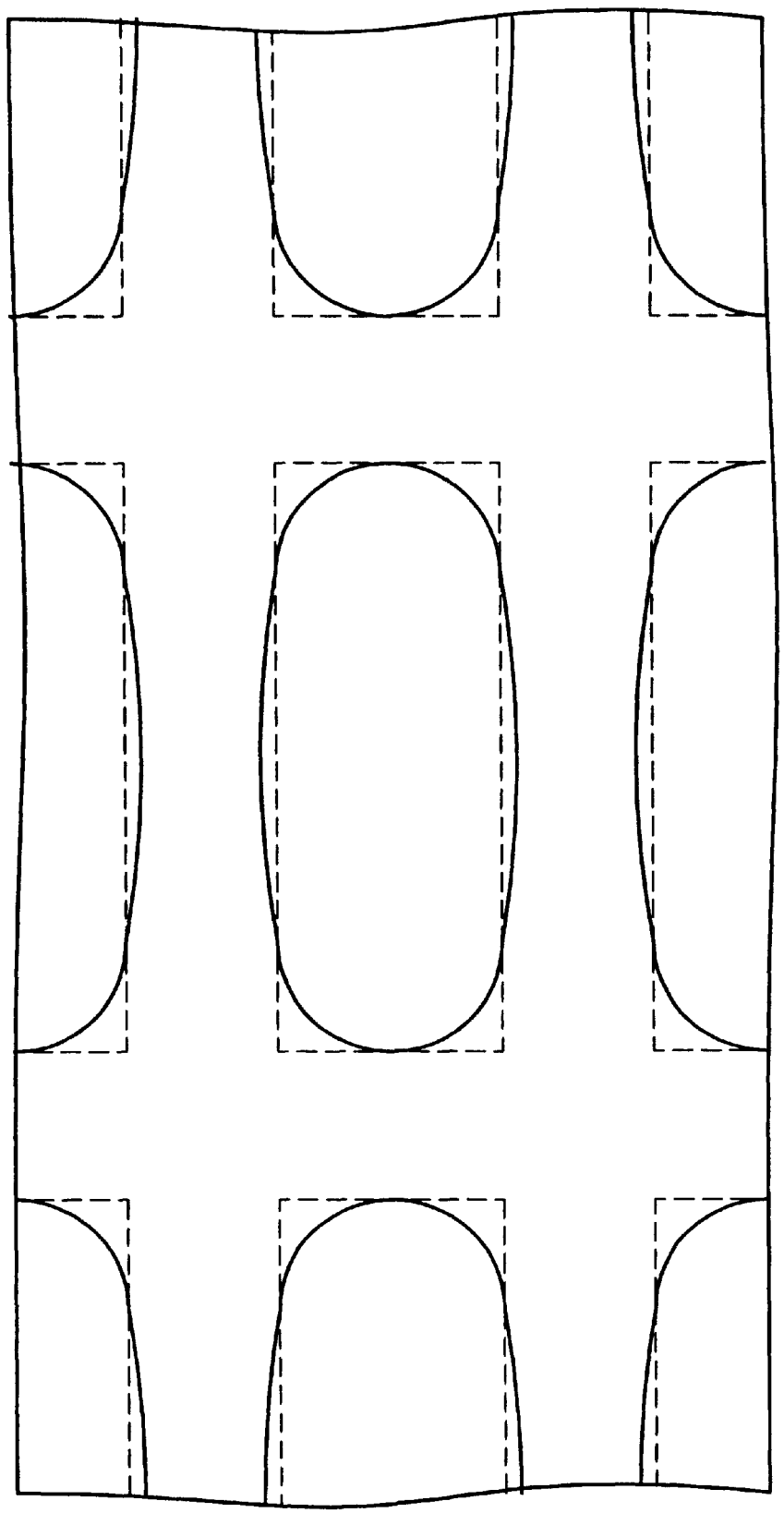
FIG. 1 shows an example of optical proximity effect.
Figure 2:
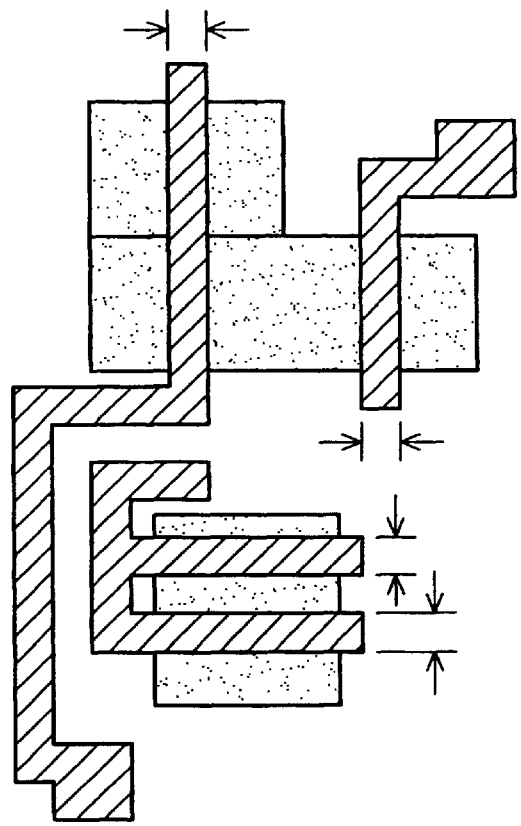
FIG. 2 shows a conventional method to determine the pattern to be corrected.
Figure 3A:
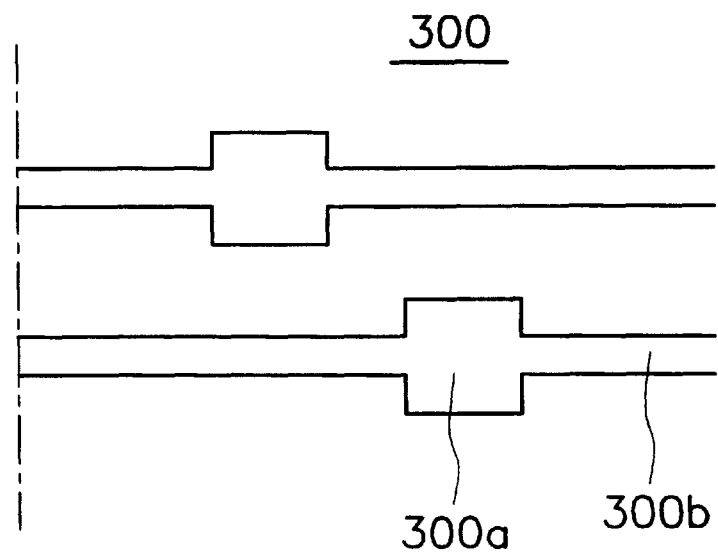
FIG. 3A shows an original pattern to be corrected in a preferred embodiment according to the invention.
Figure 3B:
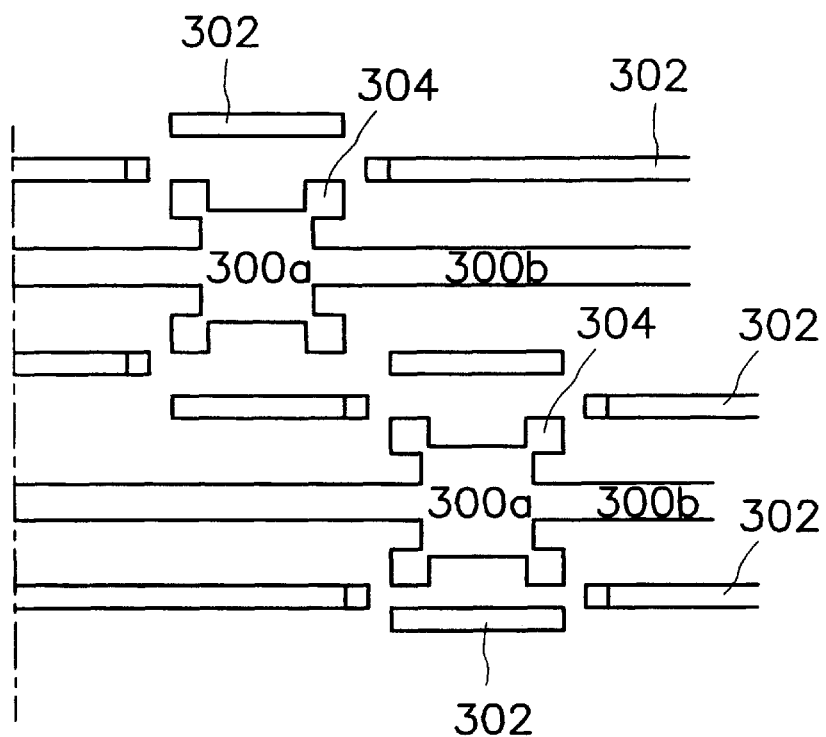
FIG. 3B shows a corrected pattern of the original pattern as shown in FIG. 3A.

In FIG. 3A, an original main pattern 300 is provided. The main pattern 300 comprises a rectangle pattern 300a and a strip pattern 300b. The critical dimension of the main pattern is obtained. When the critical dimension is less than or equal to a wavelength of a light source used for exposure, an assist feature is added to the main pattern 300. While the critical dimension is less than or equal to 2.5 times of the wavelength, a serif is added on each corner of the main pattern 300, or a hammer head is add on one side of a trunk of the pattern. For example, as shown in FIG. 3B, an assist feature 302 is added to the main pattern 300. When the critical dimension is less than or equal to the wavelength, a serif 304 is added on each of the corners of the rectangle pattern 300a. The addition of the serif or the hammerhead improves fidelity of the pattern, while the addition of the assist feature increases a contrast of the pattern to result in a higher resolution.

However, as shown in FIG. 3B, since the assist feature 302 is added before adding the serifs 304, it can be observed from the figure that a distance between two neighboring patterns is too small. In some occasions, the patterns may even overlap with each other to cause some unwanted connection.

Figure 3C:
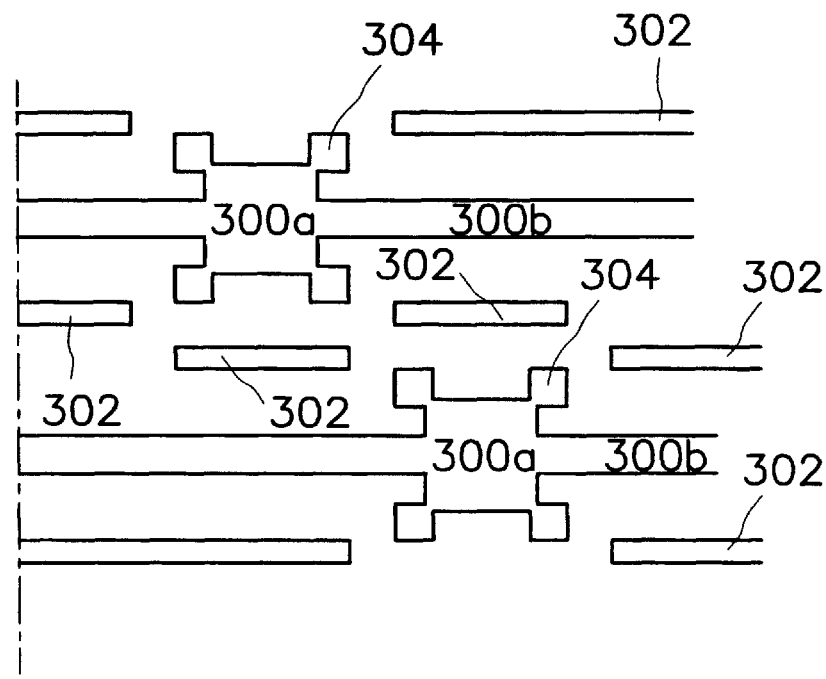
FIG. 3C shows another corrected pattern of the original pattern as shown in FIG. 3A.

The drawback in FIG. 3B may be resolved by arranging a sequence for the addition between the serif/hammerhead and the assist feature. That is, adding a serif/hammerhead to the main pattern first. The assist feature is then added according to the pattern corrected with the serif/hammerhead. An adjustment of the assist feature can be made to perform an appropriate correction. In FIG. 3C, a main pattern 300 comprising a rectangle pattern 300a and a strip pattern 300b is provided. The critical dimension of the main pattern 300 is checked to determine whether the critical dimension is less than or equal to 2.5 times of a wavelength of a light source for exposure. If so, a serif is added to each corner of the rectangle pattern 300a. After the addition of the serif 304, the assist feature 302 is added. As a result, the problem of overly close patterns or overlap of patterns is thus resolved.

Figure 4:
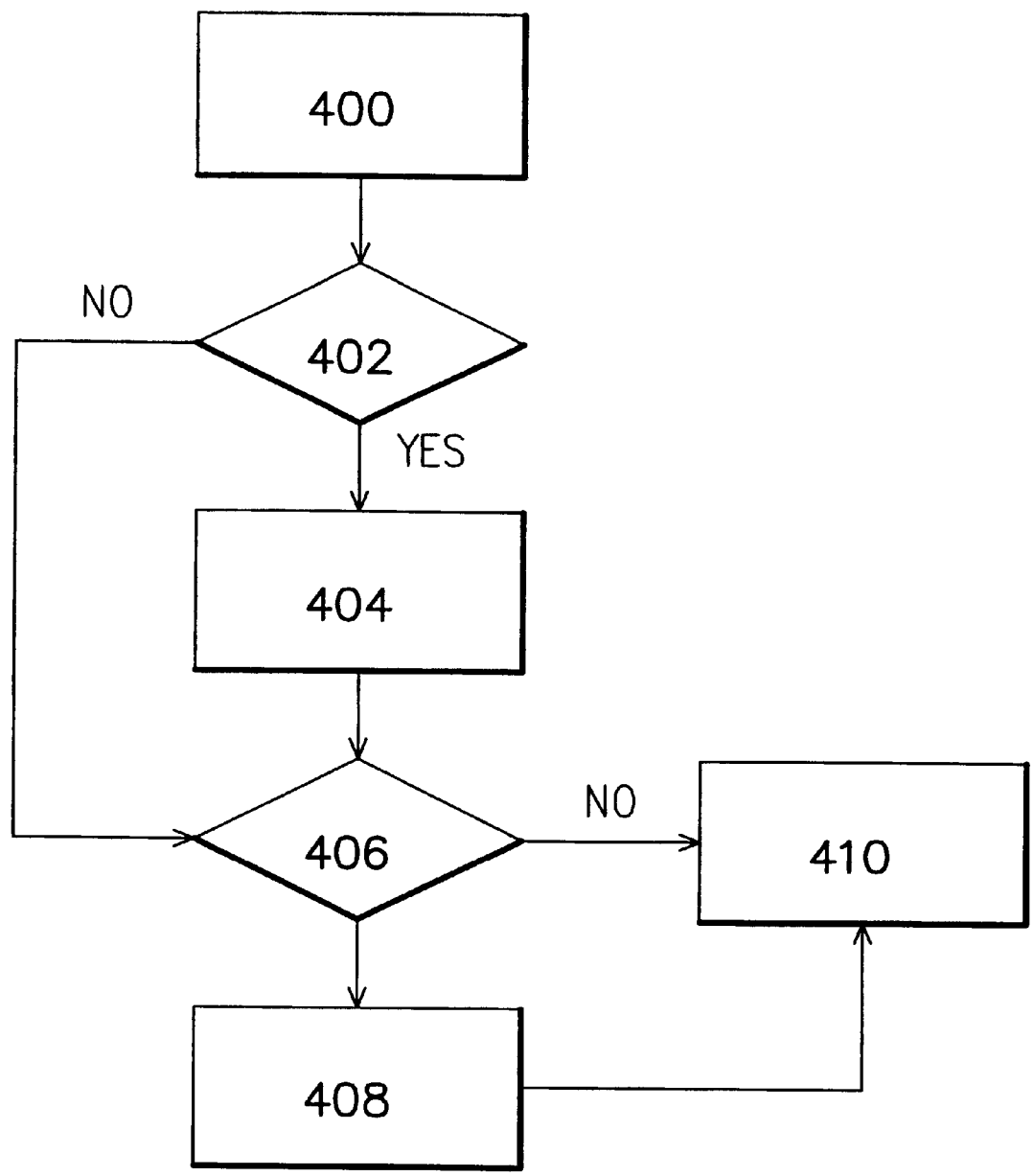
FIG. 4 shows a flow chart for performing an optical proximity correction in an embodiment according to the invention.

The flow chart of the invention can be referred to FIG. 4. In step 400, a main pattern to be transferred is provided. The critical dimension of the main pattern is checked in step 402. If the critical dimension is larger than 2.5 times of the wavelength of a light source, neither a serif nor a hammerhead is added onto the main pattern in step 404. If the critical dimension is no larger than 2.5 times of the wavelength of a light source for exposure, a serif or a hammerhead is added onto the main pattern in step 404. The critical dimension is checked again in step 406. If the critical dimension is no larger than the wavelength, an assist feature is added onto the main pattern 300 in step 408. If the critical dimension is larger than 2.5 the wavelength, no assist feature is added and step 408 is passed. After the steps described above, a photolithography process is performed in step 410. The rest of the steps for photolithography involve conventional techniques and are not further described herein.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of optical proximity correction, comprising:
   providing a main pattern, which comprises a block pattern and a line pattern;
   checking a critical dimension of the main pattern;
   adding a line pattern to the line pattern when the critical dimension is less than or equal to a reference factor of a wavelength of a light source for exposure to form a corrected pattern;
   checking a critical dimension of the corrected pattern; and
   after adding the line pattern, adding a block correction pattern to the block pattern when the critical dimension is less than or equal to a wavelength of a light source for exposure.

2. The method according to claim 1, wherein the reference factor is 2.5.

3. The method according to claim 1, wherein the step of adding the block correction pattern is performed before the step of adding the line correction pattern.

4. The method according to claim 1, wherein the step of adding the line correction pattern is performed before the step of adding the block correction pattern.

5. The method according to claim 1, wherein the step of adding the block correction pattern comprises adding the block correction pattern corners of the block pattern.

6. The method according to claim 1, wherein the step of adding the line correction pattern comprises adding an assistant feature adjacent to the line pattern for increasing line contrast.

7. A method of optical proximity correction, comprising:
   providing a main pattern, which comprises a line pattern and a block pattern;
   checking a critical dimension of the main pattern;
   adding a block pattern to the block pattern when the critical dimension is less than or equal to a reference factor of a wavelength of a light source for exposure to form a corrected pattern;
   checking a critical dimension of the corrected pattern; and after adding the block pattern, adding a line correction pattern to the line pattern when the critical dimension is less than or equal to a wavelength of a light source for exposure.

8. The method according to claim 7, wherein the reference factor is 2.5.

9. The method according to claim 7, wherein the step of adding the block correction pattern is performed before the step of adding the line correction pattern.

10. The method according to claim 7, wherein the step of adding the line correction pattern is performed before the step of adding the block correction pattern.

11. The method according to claim 7, wherein the step of adding the block correction pattern comprises adding the block correction pattern corners of the block pattern.

12. The method according to claim 7, wherein the step of adding the line correction pattern comprises adding an assistant feature adjacent to the line pattern for increasing line contrast.

13. A method of optical proximity correction, comprising:
providing a main pattern, which comprises a block pattern and a line pattern;
checking a critical dimension of the main pattern; and
deciding not adding any correction pattern when the critical dimension is larger than a reference factor of a wavelength of a light source for exposure.

14. The method according to claim 13, wherein the reference factor is 2.5.

* * * * *